United States Patent
Yeh et al.

(10) Patent No.: US 6,940,104 B2
(45) Date of Patent: Sep. 6, 2005

(54) CASCADED DIODE STRUCTURE WITH DEEP N-WELL AND METHOD FOR MAKING THE SAME

(75) Inventors: Ta-Hsun Yeh, Hsin Chu (TW); Chao-Cheng Lee, Science-Based Industrial Park (TW); Tay-Her Tsaur, Tai Nan (TW)

(73) Assignee: Realtek Semiconductor Corp., Hsin Chu (TW)

( * ) Notice: Subject to any disclaimer, the term of this patent is extended or adjusted under 35 U.S.C. 154(b) by 0 days.

(21) Appl. No.: 10/844,455

(22) Filed: May 13, 2004

(65) Prior Publication Data

US 2005/0012156 A1 Jan. 20, 2005

(30) Foreign Application Priority Data

Jul. 16, 2003 (TW) ........................................ 92119466 A

(51) Int. Cl.$^7$ ........................ H01L 29/861; H01L 29/88
(52) U.S. Cl. ...................... 257/104; 257/105; 257/106; 257/109; 257/199; 257/355; 257/356; 257/360; 257/361; 257/362
(58) Field of Search ................................ 257/104–106, 257/109, 199, 355, 356, 360–362

(56) References Cited

U.S. PATENT DOCUMENTS

| | | | |
|---|---|---|---|
| 5,616,943 A | * | 4/1997 | Nguyen et al. ............. 257/355 |
| 6,531,744 B2 | | 3/2003 | Van Lieverloo |
| 6,537,868 B1 | | 3/2003 | Yu |

FOREIGN PATENT DOCUMENTS

TW          530405          8/2001

* cited by examiner

*Primary Examiner*—Thien F Tran
(74) *Attorney, Agent, or Firm*—Birch, Stewart, Kolasch & Birch, LLP

(57) ABSTRACT

A cascaded diode structure with a deep N-well for effectively reducing the leakage current of the P-type substrate by floating the base of a parasitic transistor in the cascaded diode structure. The cascaded diode structure includes a P-type substrate, a deep N-well formed on the P-type substrate, a plurality of elemental diodes formed on the deep N-well, and a plurality of connecting parts for cascading the elemental diodes. Each elemental diode includes a P-well formed on the deep N-well, a heavily doped P-type region formed on the P-well, and a heavily doped N-type region formed on the P-well.

12 Claims, 5 Drawing Sheets

| | Emitter Dimension | Vceo | Vcbo | Vebo |
|---|---|---|---|---|
| PNP BJT | 10um*10um | > 10V | > 15V | > 15V |

US 6,940,104 B2

CASCADED DIODE STRUCTURE WITH DEEP N-WELL AND METHOD FOR MAKING THE SAME

This application claims the benefit of the filing date of Taiwan Application Ser. No. 092119466, filed Jul. 16, 2003, the content of which is incorporated herein by reference.

BACKGROUND OF THE INVENTION

1. Field of the Invention

The invention relates to a cascaded diode, and more particularly to a cascaded diode with a deep N-well structure and a method for making the same.

2. Description of the Related Art

In order to constitute a high circuit-integration density and achieve desired functions, a metal-oxide-semiconductor field-effect transistor (MOSFET) with reduced size has been used in the advanced integrated circuit (IC) technology. However, in order to satisfy the requirement of constant field scaling, the level of a power supply voltage is also scaled down in certain IC technology. Hence, computer architectures may require an interface to connect semiconductor chips or sub-systems having different power supply voltages. Owing to the hybrid power supply voltages, the I/O circuit of the interface between chips tends to have the functions of avoiding overstress and/or improper current leakage pathways. The ESD protection circuits are therefore introduced to account for such phenomena.

FIG. 1 shows a block diagram of an integrated circuit having an ESD clamp circuit. Referring to FIG. 1, the conventional integrated circuit 10 includes an input pad 11, an output pad 13, an internal circuit 12, an input pad ESD clamp circuit 14, an output pad ESD clamp circuit 15, and a power rail ESD clamp circuit 16. The ESD clamp circuits 14, 15, and 16 protect the internal circuit 12 from ESD damage. That is, when there are electrostatic charge induced excessive current flowing into the integrated circuit 10 through the pads, the voltage sources VDD, VSS, and the like, the ESD clamp circuits bypasses the electrostatic current without damaging the internal circuit 12.

FIG. 2 shows a power rail ESD clamp circuit using cascaded diodes. As shown in FIG. 2, the power rail ESD clamp circuit 16 is composed of m elemental diodes D1 to Dm. A first power supply voltage VDD is connected to the P terminal of a first elemental diode D1, and a second power supply voltage VSS is connected to the N terminal of the m-th elemental diode Dm. The voltage of the first power supply voltage VDD is higher than that of the second power supply voltage VSS. Each elemental diode has a turn-on voltage, typically 0.8V. A large current is allowed to flow through the elemental diodes when the voltage across the two terminals of the elemental diodes is higher than the turn-on voltage. Therefore, the number of the cascaded diodes may be properly assigned to meet the ESD protection requirement of the clamp circuit.

FIG. 3 shows a structure of a conventional cascaded diode set disclosed in U.S. Pat. No. 6,537,868, entitled "Method for forming novel low leakage current cascaded diode structure", the content of which is hereby incorporated by reference. The cascaded diode set 16 serves as the ESD clamp circuit. As shown in FIG. 3, the cascaded diode set 16 is formed on a P-type substrate 161 and includes a plurality of elemental diodes. Each elemental diode includes a deep N-well (DNW) 162 formed on the P-type substrate 161, a N-well 163 formed above the deep N-well 162, a heavily doped P-type (P+) region 164 formed in the N-well 163, and a heavily doped N-type (N+) region 165 formed in the N-well 163. As a result of the above depicted structure, a parasitic transistor 166 is formed in each elemental diode, constituted by the heavily doped P-type region 164, the N-well 163 (including the deep N-well 162 and the heavily doped N-type region 165), and the P-type substrate 161.

FIG. 4 shows a circuit of the parasitic transistors in the cascaded diodes of FIG. 2. As is obvious to those of ordinary skill in the art, the cascaded diode set 16 suffers from the leakage current path through the parasitic transistors 166. Although such leakage current may be alleviated by the deep N-well 162, it cannot be effectively reduced.

SUMMARY OF THE INVENTION

Therefore, one of the objects of the invention is to provide a cascaded diode with a deep N-well for effectively reducing the leakage current leaking through the P-type substrate.

According to an embodiment of the invention, a cascaded diode structure is disclosed. The cascaded diode structure comprises a P-type substrate; a deep N-well formed on the P-type substrate; a plurality of elemental diodes formed on the deep N-well, each of the elemental diodes comprising a P-well formed on the deep N-well, a heavily doped P-type region formed on the P-well, and a heavily doped N-type region formed on the P-well; and a plurality of connecting parts for cascading the a plurality of elemental diodes.

According to an embodiment of the invention, a method for forming a cascaded diode structure is also disclosed. The method comprises the steps of forming a deep N-well on a P-type substrate; forming a plurality of elemental diodes on the deep N-well, each of the elemental diodes comprising a P-well on the deep N-well, and a heavily doped P-type region and a heavily doped N-type region on the P-well; and cascading the plurality of elemental diodes, wherein the heavily doped P-type region of each diode is electrically connected to the heavily doped N-type region of an adjacent diode.

According to an embodiment of the invention, an ESD clamp circuit coupled between a first power supply voltage source and a second power supply voltage source, and utilizing the cascaded diode structure mentioned above is further disclosed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

Figure 5:
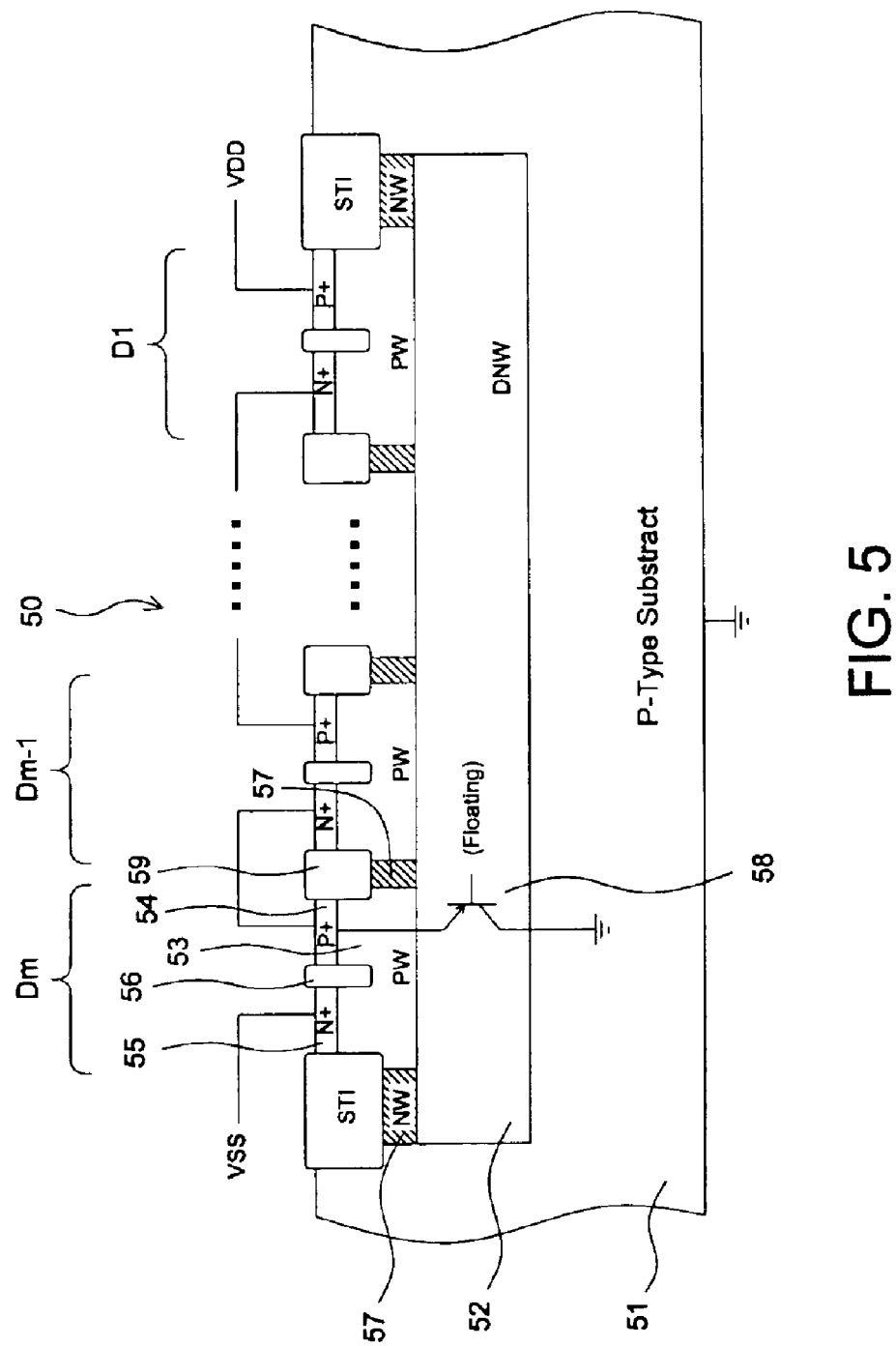
FIG. 5 shows a structure of the cascaded diodes with a deep N-well according to an embodiment of the invention.

FIG. 5 shows a set of cascaded diodes with a deep N-well according to an embodiment of the invention. As shown in FIG. 5, the cascaded diode set 50 includes a P-type substrate 51, a deep N-well 52, a plurality of elemental diodes $D_1$ to $D_m$ and connecting wirings. The deep N-well 52 is fabricated in the P-type substrate 51. Each elemental diode is fabricated above the deep N-well 52 and includes a P-well 53 formed above the deep N-well 52, a heavily doped P-type region 54 formed on the P-well 53, and a heavily doped N-type region 55 formed on the P-well 53. The heavily doped P-type region 54 and the heavily doped N-type region 55 are isolated by a shallow trench isolation (STI) structure 56. In addition, the P-wells 53 of adjacent diodes are separated by N-wells 57. A shallow trench isolation 59 is also formed on top of each N-well 57 for isolating the heavily doped P-type region 54 from the heavily doped N-type region 55 of an adjacent diode.

In addition, the heavily doped P-type region 54 of each but the first elemental diode $D_1$ is connected to the heavily doped N-type regions 55 of an adjacent diode via a connecting part, such as metal wiring, such that the elemental diodes are cascaded. The heavily doped P-type region 54 of the first diode D1 is connected to the first power supply voltage VDD, and the heavily doped N-type region 55 of the last diode Dm is connected to the second power supply voltage VSS, wherein the first power supply voltage VDD is higher than the second power supply voltage VSS.

Referring to FIG. 5 again, a parasitic transistor 58 is formed, which is constituted by the heavily doped P-type region 54 (including the P-well 53), the deep N-well 52, and the P-type substrate 51 in the cascaded diode set 50. However, as illustrated in the drawing, the base of the transistor 58 is in a floating state. More specifically, the base of the parasitic transistor 58 is not connected to the heavily doped region 55.

Figures 6, 7:
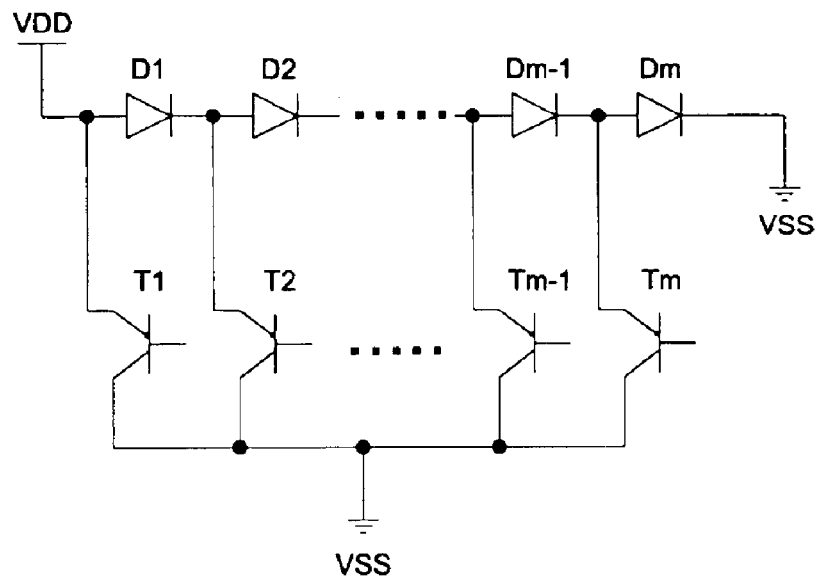
FIG. 6 shows a circuit corresponding to the cascaded diodes with the deep N-well according to an embodiment of the invention.
FIG. 7 shows the breakdown voltage characteristic of a parasitic PNP bipolar transistor according to an embodiment of the invention.

FIG. 6 shows a schematic diagram corresponding to the cascaded diode set 50 with the deep N-well according to an embodiment of the invention. Referring to FIG. 6, the cascaded diode set 50 includes m serially connected diodes D1 to Dm, and m parasitic transistors T1 to Tm. However, it is readily appreciable to those of ordinary skill in the art from FIG. 6 that, the emitter of each of the parasitic transistors T1 to Tm is connected to the heavily doped P-type region 54 of the elemental diode, the base thereof is floated, and the source thereof is grounded. Because the bases of the parasitic transistors are floated, the leakage current flowing toward the source through the emitter can be effectively reduced.

Hence, the cascaded diode set with the deep N-well according to an embodiment of the invention utilizes the cascaded elemental diodes fabricated above the floating deep N-well to effectively reduce the leakage current leaking through the P-type substrate.

The deep N-well may be fabricated using high-energy ion implantation (for example, with energy higher than 1,000,000 electron volts). Therefore, the depth and thickness of the deep N-well may be as small as, for example, only 1 um and 1.5 um, respectively. Therefore, no hazardous influence upon the electrical property of the cascaded diodes close to the substrate surface will be induced.

Because the parasitic PNP bipolar transistor (BJT) is formed incorporating the deep N-well, the doping concentrations at the emitter (P-well), the base (deep N-well), and the collector (P-type substrate) may be far lower according to an embodiment of the present invention. Therefore, a higher breakdown voltage and a lower interface current leakage may be resulted. FIG. 7 shows an exemplary breakdown voltage characteristic of a parasitic PNP bipolar transistor according to an embodiment of the invention.

Moreover, as mentioned above, the exemplary 1.5 um-thick deep N-well can effectively reduce the current gain of the parasitic PNP bipolar transistors. The low current gain may prevent the noise from triggering the base (deep N-well) to generate the collector (P-type substrate) leakage current.

Figure 1:
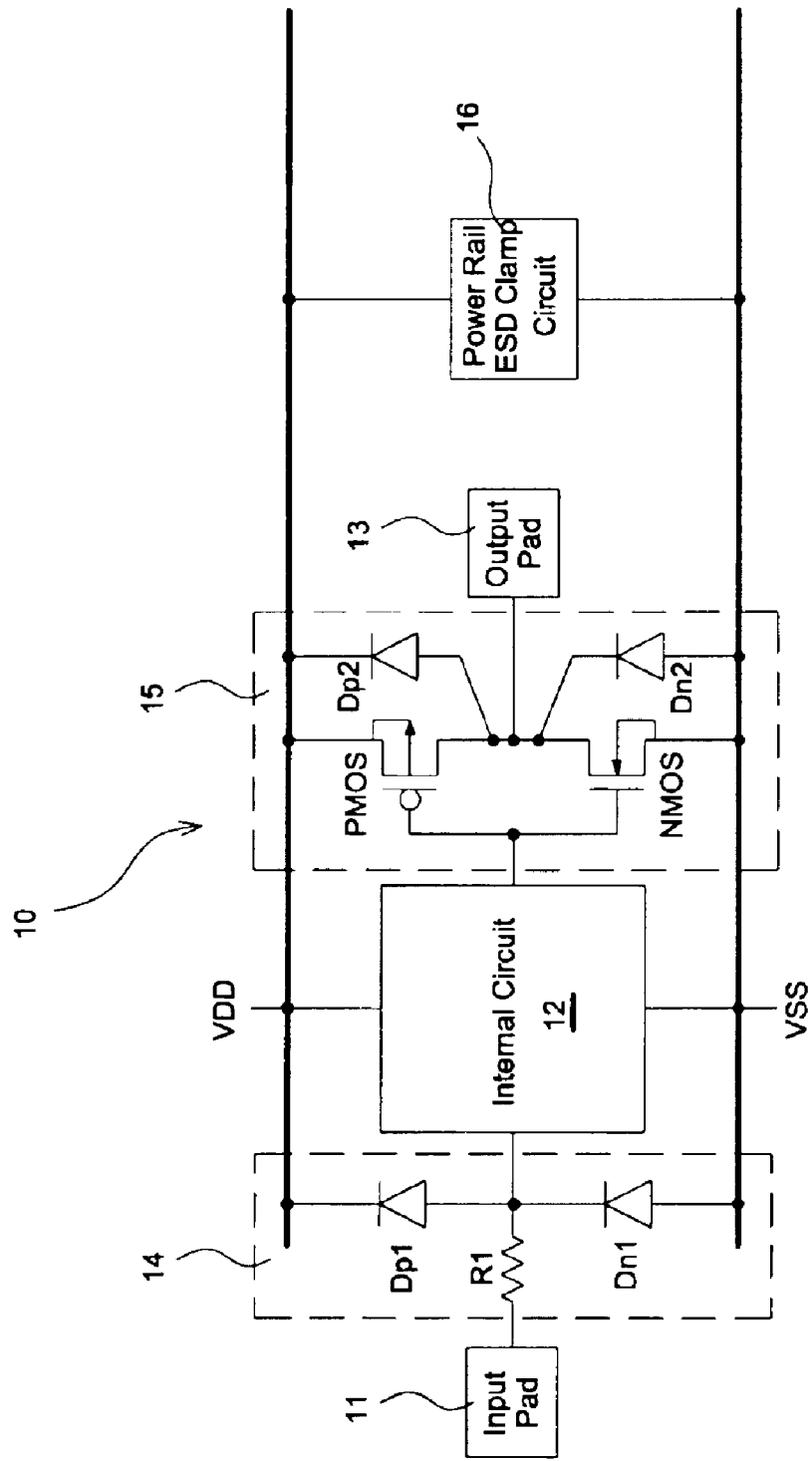
FIG. 1 shows a block diagram of an integrated circuit having ESD clamp circuits.
Figure 2:
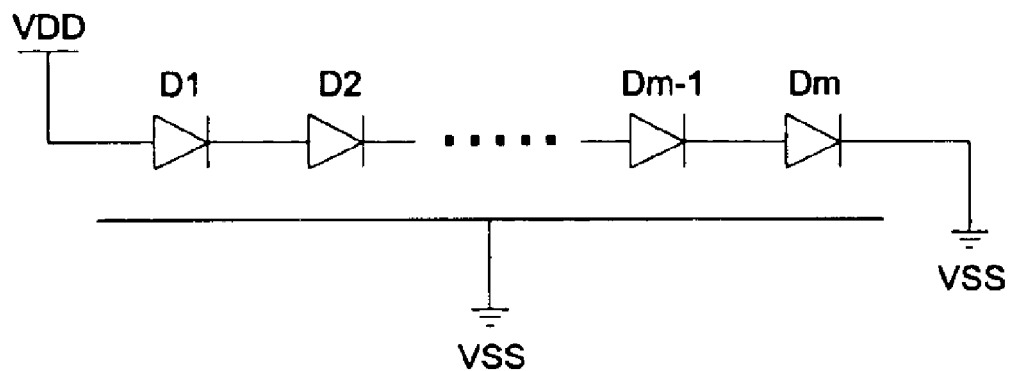
FIG. 2 shows an ESD clamp circuit using serially connected diodes.
Figure 4:
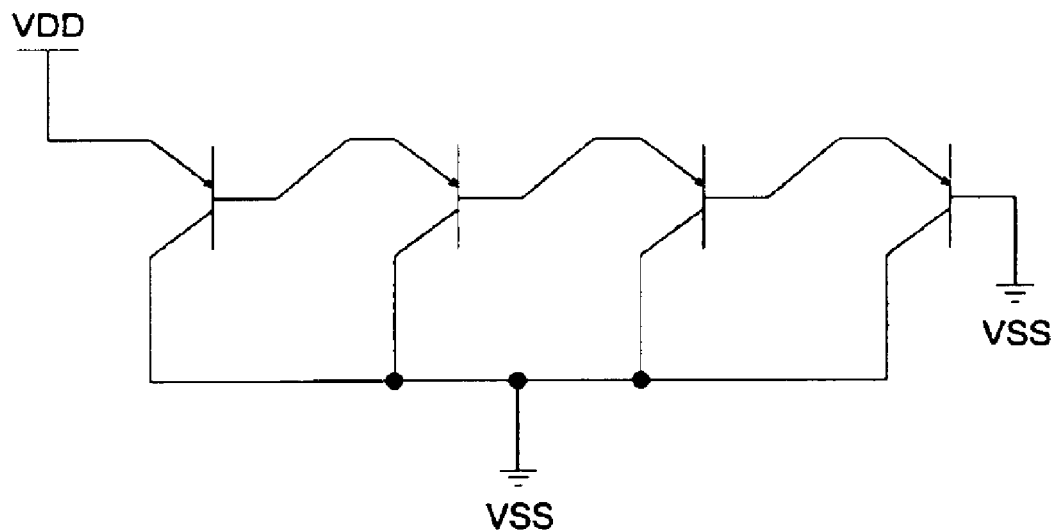
FIG. 4 shows a circuit of the parasitic transistors in the cascaded diodes of FIG. 2.
Figure 3:
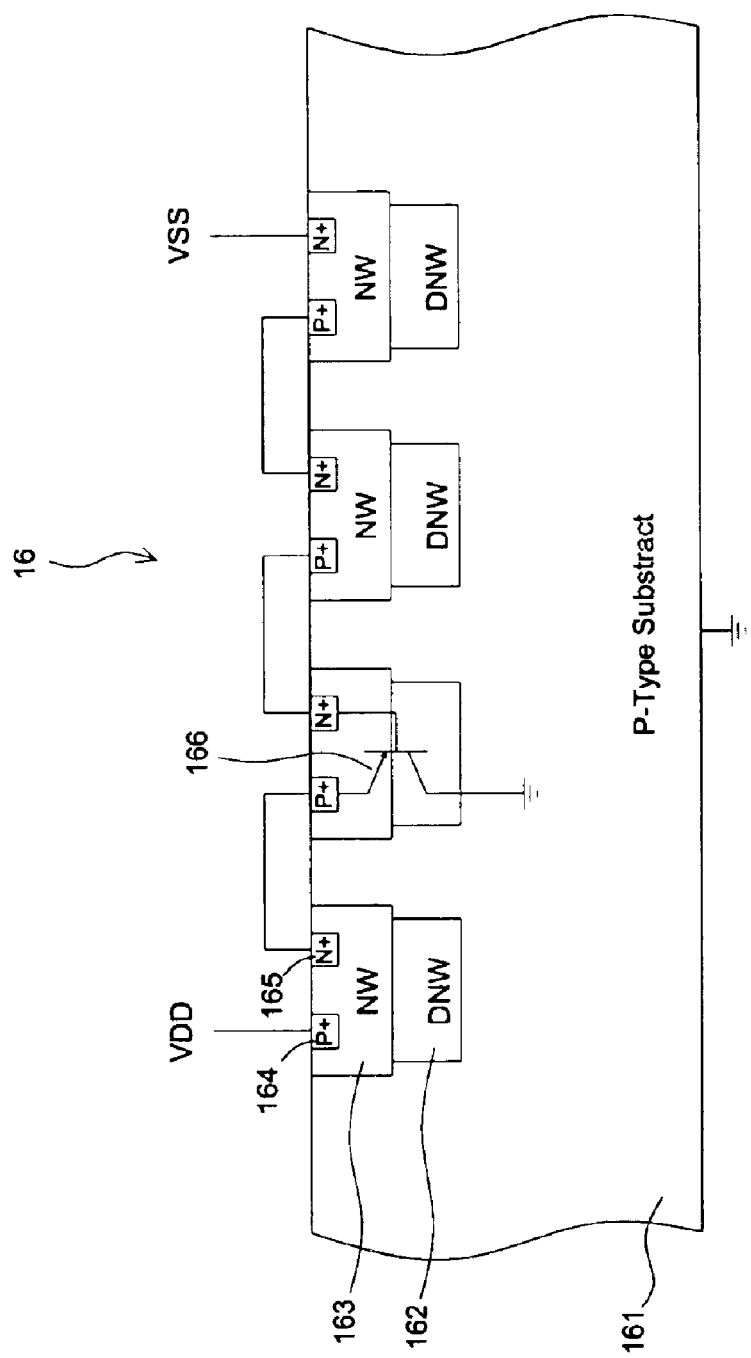
FIG. 3 shows a structure of a conventional cascaded diode set.

As such, the cascaded diode set according to embodiments of the present invention as described and illustrated above is suitable for being utilized as an ESD clamp circuit, particularly, a power rail ESD clamp circuit between VDD and VSS, as exemplified in FIG. 1.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. A cascaded diode structure, comprising:
   a P-type substrate;
   a deep N-well formed on the P-type substrate;
   a plurality of elemental diodes formed on the deep N-well, each of the elemental diodes comprising a P-well formed on the deep N-well, a heavily doped P-type region formed on the P-well, and a heavily doped N-type region formed on the P-well; and
   a plurality of connecting parts for cascading the plurality of elemental diodes.

2. The cascaded diode structure according to claim 1, wherein the P-well, the deep N-well, and the P-type substrate constitute a parasitic bipolar transistor, and the base of the parasitic bipolar transistor is floated.

3. The cascaded diode structure according to claim 1, for each of the elemental diodes further comprising a first N-well formed on the deep N-well and around the P-well so as to isolate the P-wells of the plurality of elemental diodes.

4. The cascaded diode structure according to claim 3, further comprising a plurality of isolation structures formed on the first N-wells in order to isolate the heavily doped regions between adjacent elemental diodes.

5. The cascaded diode structure according to claim 4, wherein the plurality of isolation structures are shallow trench isolation structures.

6. The cascaded diode structure according to claim 1, further comprising a plurality of isolation structures formed on the P-wells in order to isolate the heavily doped regions within the elemental diodes.

7. The cascaded diode structure according to claim 6, wherein the plurality of isolation structures are shallow trench isolation structures.

8. An ESD clamp circuit coupled between a first power source and a second power source, the ESD clamp circuit comprising:
   a cascaded diode structure coupled between the first and the second power sources, wherein the cascaded diode structure comprises:
   a P-type substrate;
   a deep N-well formed on the P-type substrate;
   a plurality of elemental diodes formed on the deep N-well, each of the elemental diodes comprising a P-well formed on the deep N-well, a heavily doped P-type region formed on the P-well, and a heavily doped N-type region formed on the P-well; and a plurality of connecting parts for cascading the plurality of elemental diodes.

9. The ESD clamp circuit according to claim 8, wherein the P-well, the deep N-well, and the P-type substrate constitute a parasitic bipolar transistor, and the base of the parasitic bipolar transistor is floated.

10. The ESD clamp circuit according to claim 8, for each of the elemental diodes further comprising a first N-well formed on the deep N-well and around the P-well so as to isolate the P-wells of the plurality of elemental diodes.

11. The ESD clamp circuit according to claim 10, further comprising a plurality of isolation structures formed on the first N-wells in order to isolate the heavily doped regions between adjacent elemental diodes.

12. The ESD clamp circuit according to claim 8, further comprising a plurality of isolation structures formed on the P-wells in order to isolate the heavily doped regions within the elemental diodes.

* * * * *